United States Patent
Chen et al.

(10) Patent No.: US 7,304,470 B2
(45) Date of Patent: Dec. 4, 2007

(54) FAN OPERATING STATUS MONITORING SYSTEM

(75) Inventors: Wei-I Chen, Taipei (TW); Chin-Lung Lien, Taipei (TW)

(73) Assignee: Inventec Corporation, Shih-Lin District, Taipei (TW)

( * ) Notice: Subject to any disclaimer, the term of this patent is extended or adjusted under 35 U.S.C. 154(b) by 158 days.

(21) Appl. No.: 11/252,473

(22) Filed: Oct. 17, 2005

(65) Prior Publication Data

US 2007/0085527 A1   Apr. 19, 2007

(51) Int. Cl.
 *G01P 3/46* (2006.01)
 *G01P 3/48* (2006.01)

(52) U.S. Cl. .................................... 324/177; 324/166

(58) Field of Classification Search ............... 324/177, 324/166, 510, 511, 772; 340/648
See application file for complete search history.

(56) References Cited

U.S. PATENT DOCUMENTS

| | | | | |
|---|---|---|---|---|
| 4,977,375 A | * | 12/1990 | Toth | 324/511 |
| 6,060,879 A | * | 5/2000 | Mussenden | 324/76.39 |
| 6,130,533 A | * | 10/2000 | Lee et al. | 324/177 |
| 6,163,266 A | * | 12/2000 | Fasullo et al. | 340/664 |
| 6,230,105 B1 | * | 5/2001 | Harris et al. | 702/57 |
| 7,064,509 B1 | * | 6/2006 | Fu et al. | 318/439 |
| 2006/0176186 A1 | * | 8/2006 | Larson et al. | 340/635 |

\* cited by examiner

*Primary Examiner*—Reena Aurora
*Assistant Examiner*—Kenneth J Whittington
(74) *Attorney, Agent, or Firm*—Fulbright & Jaworski L.L.P.

(57) ABSTRACT

A fan operating status monitoring system includes a detecting module to detect pulsation currents generated by the rotation of a fan, and further convert the detected pulsation currents to voltage signals, thereby allowing a differential magnifying module, a first processing module, and a control module to process the pulse wave signals in orders to measure the rotation speeds of the fan. Also, the second processing module and the control module can process the pulsation electric current signals so as to calculate the working currents of the fan, thereby expanding the measuring range of the rotation speeds of the fan, and at the same time, effectively controlling the operating status of the fan.

9 Claims, 2 Drawing Sheets

FAN OPERATING STATUS MONITORING SYSTEM

BACKGROUND OF THE INVENTION

1. Field of the Invention

The present invention relates in general to monitoring systems, and more particularly, to a monitoring system for detecting the operating status of a cooling fan installed in a computer system.

2. Description of Related Art

As the value and use of information continues to increase, individuals and businesses seek additional ways to process and store information. One option available to users is computer systems which have become indispensable to modern life. A computer system generally processes, compiles, stores, and/or communicates information or data for business, personal, or other purposes thereby allowing users to take advantage of the value of the information. Computer systems have adapted over time to handle an increasing number of tasks with processors and other components that operate at increased cycles to perform increased numbers of calculations in reduced time. One problem that arises with more powerful processing components is that such components tend to create increased amounts of excess heat.

In order to ensure proper operation of the components, a computer system typically incorporates cooling equipment, such as a cooling fan that maintains a flow of external air through the computer system chassis and over the processing components. To maintain adequate cooling airflow, computer system manufacturers generally layout components within the chassis to effectively transfer excess heat while also attempting to meet other design constraints. As excess heat built up in a computer system may lead to computer breakdown or even damages to the electronic components of a computer system, it appears critical for the industry to come up with an effective heat dissipation system in high-speed operation of computer systems.

Currently, for fan speed measurement it is primarily adopted by manufacturers to use infrared photo reflex type rotation speed measuring technique, such as FOTEK mirror reflex, MG-2MX devices, and a touch speed measurement digital tachometer, such as PH-200LC of SHIMPO and so on, as well as non-touch flash frequency rotation speed measurement (digital stroboscope) such as DT-2239A. For instance, a non-touch flash frequency meter is adapted to monitor a high-speed rotating object (such as a fan), by adjusting the flash frequency of a flash frequency meter to simulate or even synchro the rotating speed of the objected being tested. Under the snychro condition, an object being tested rotates in high speeds would appear to rotate slowly or even in an idle state. This temporary vision-suspending phenomenon allows human naked eyes to estimate or range the operating status of a high-speed rotating object easily. However, the foregoing speed measuring techniques range only about 100-1000 rpm (round per minute), which is adversely narrow to apply to wider ranges of speed measurements, moreover, the foregoing techniques are unable to measure the working currents of a fan in operation.

Therefore, there exists a need to provide an effective monitoring system for detecting the operating status of a cooling fan, which can overcome the drawbacks of the inability to measure electric currents of a working fan, as well as the limited rotating speed measuring ranges as encountered in prior art techniques.

SUMMARY OF THE INVENTION

In light of the foregoing drawbacks in the prior art, a primary objective of the present invention is to provide a fan operating status monitoring system which is capable of measuring the rotation speeds as well as the working currents of a fan.

Another primary objective of the present invention is to provide a fan operating status monitoring system which is capable of increasing and expanding the range of measuring the rotating speed of a fan.

Another primary objective of the present invention is to provide a fan operating status monitoring system which is capable of effectively monitoring and controlling the operating status of a cooling fan.

In accordance with the foregoing and other objectives, the invention proposes a novel fan operating status monitoring system, which is comprised of: a detecting module used for detecting the pulsation currents generated by the rotation of a fun, and further converting the detected pulsation currents to voltage signals; a differential magnifying module used for receiving said pulsation voltage signals, and further processing the received pulsation voltage signals by means of differential magnification and wave-filtering so as to generate analog magnified signals; a first processing module used for receiving said analog magnified signals, and further converting said analog magnified signals into pulse wave signals in order to calculate the frequency of said pulse wave signals; a second processing module used for receiving the pulse wave current signals detected by the detecting module, and further processing said pulse wave current signals so as to generate digital signals and then transmitting the digital signals to a control module; and a control module used for measuring the rotation speeds of the fan based on the frequency of the pulse wave signals calculated by the first processing module, and further measuring the working currents of the fan based on the digital signals generated by the second processing module.

The foregoing detecting module is an electric resistance in series connection with the fan, the pulsation electric current signals generated by operating the fan flow pass said electric resistance and consequently generate pulsation voltage signals, allowing said electric resistance to be used to detect said pulsation electric currents generated by the fan operation, and also to convert said pulsation electric current signals into output pulsation voltage signals.

The differential magnifying module can be a differential signal sensor circuit so as to intercept voltage signals on both ends of said electric resistance, and further proceed to magnify the intercepted voltage signals by means of differentiation and wave filtering so as to generate output of magnified signals.

The first processing module is comprised of: an analog to digital converting module used for converting the magnified signals into pulse wave signals; and a frequency-counting module used for receiving said pulse wave signals to count the frequency of said pulse wave signals, and further transmitting the counted result to said control module for measuring the rotation speeds of the fan accordingly.

The second processing module is comprised of: a first converting module used for receiving the pulsation electric signals detected by the detecting module, and further converting the pulsation electric signals into direct electric current signals; and a second converting module used for converting direct electric current signals into digital signals, allowing the control module to measure the working electric currents of the fan accordingly.

Compared to prior art techniques, the fan operating status monitoring system according to the present invention is characterized by a detecting module adapted to detect pulsation electric currents generated from operating a fan, and the generation of pulsation voltage signals allows a differential magnifying module to process differential magnification and wave-filtering on the generated pulsation voltage signals, thereby generating analog magnified signal output to a first processing module, allowing the first processing module to convert the analog magnified signal to a pulse wave signal so as to calculate the frequency of said pulse wave signals, such that a control module can further calculate the rotation speeds of a fan according to the obtained frequency from said pulse wave signals. Therefore, the invention employs a detecting module to detect tiny pulsation electric currents generated from operating a fan that generates pulsation voltage signals, and said first processing module is provided for processing a differential magnification and wave-filtering so as to expand the range of measuring the rotation speeds of a fan.

Further, the fan operating status monitoring system of the invention is capable of converting the detected pulsation electric current signals into digital signals by a second processing module, thereby allowing said control module to calculate electric currents of a fan and to solve the defect of prior art technique.

Moreover, the fan operating status monitoring system of the invention is capable of accurately and precisely calculate the rotation speeds and working electric currents of a fan, allowing said control module to effectively monitor and control the operating status of a fan to ensure its operating reliability.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
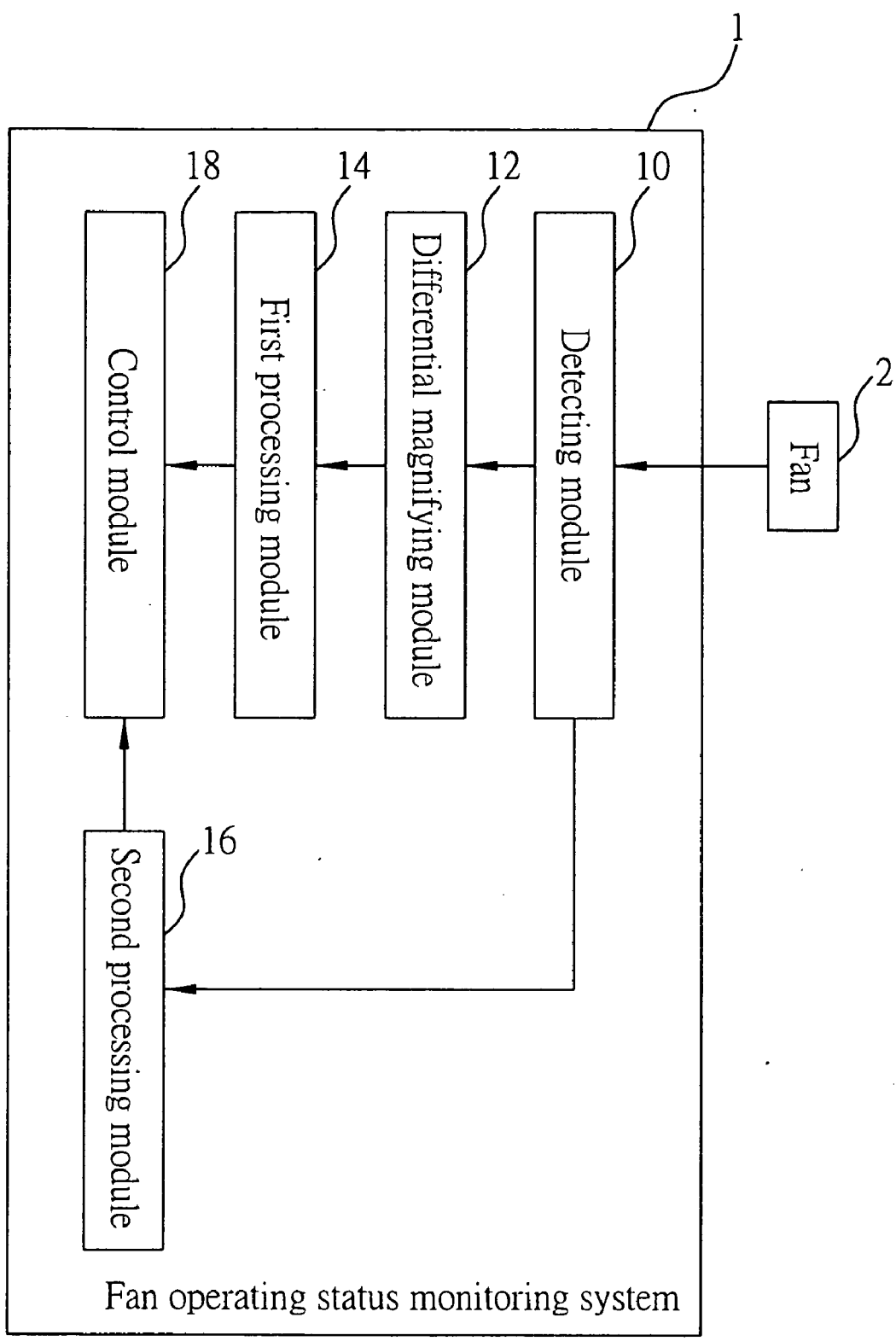
FIG. 1 is a schematic diagram showing the application architecture of the fan operating status monitoring system according to the invention.

FIG. 1 illustrates the application architecture of the fan operating status monitoring system according to the invention. As shown, the monitoring system 1 of the invention is adapted to monitor the operating status of a fan 2, comprising: a detecting module 10, a differential magnifying module 12, a first processing module 14, a second processing module 16, and a control module 18.

Figure 2A:
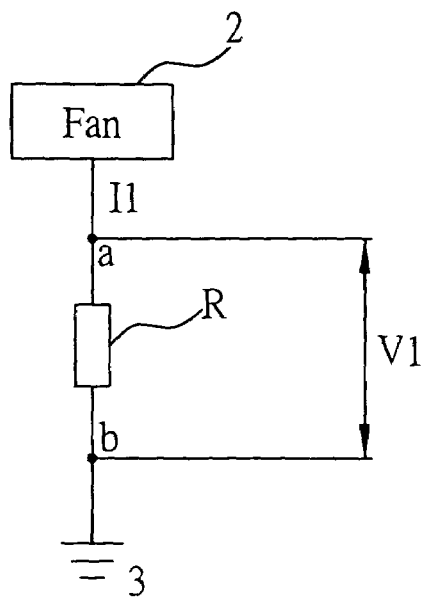
FIG. 2A is a schematic diagram showing the structure of a detecting module as shown in FIG. 1.

The detecting module 10 is used for detecting a pulsation current 11 generated from the rotation of the fun 2, and further converting the detected pulsation current to a voltage signal V1. In this embodiment, the detecting module 10 is an electric resistance R (as shown in FIG. 2A) in series connection with the fan 2, each of two ends a, b of said electric resistance R being connected to the fan 2 and a grounding terminal 3 respectively, so as to convert the pulsation signal I1 flowing through said electric resistance R into a pulsation voltage signal V1.

The differential magnifying module 12 is used for receiving said pulsation voltage signal V1, and further processing the received pulsation voltage signal V1 by differential magnification and wave filtering so as to generate an analog magnified signal. In this embodiment, the pulsation voltage signal V1 is transmitted by a wire cable (not shown) to the differential magnifying module 12 for magnification processing, as well as filtering out the interference of noise signals during transmission. The differential magnifying module 12 is a differential signal sensor circuit used to intercept voltage signals on both ends of said electric resistance, and also proceed to magnify the intercepted voltage signals by means of differentiation and wave filtering so as to generate and output the magnified signals to the first processing module 14. Moreover, the foregoing differential signal sensor circuit can be replaced with an electronic device or circuit having similar functions depending on the practical implementations and requirements.

Figure 2B:
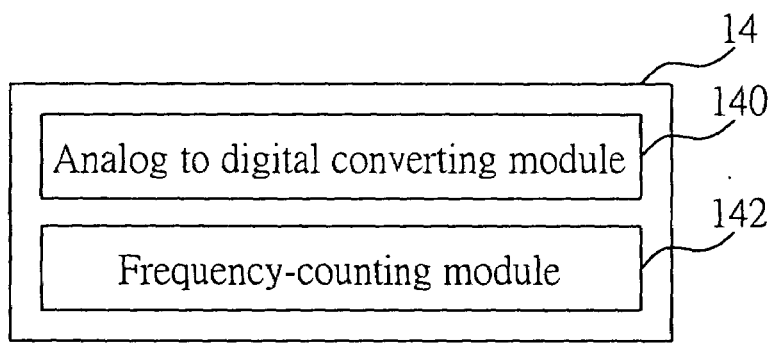
FIG. 2B is a schematic diagram depicting the structure of a first processing module as shown in FIG. 1.

The first processing module 14 is used for receiving said analog magnified signal generated by the differential magnifying module 12, and further converting said analog magnified signal into a pulse wave signal (a square pulse wave signal) so as to measure the frequency of said pulse wave signal by counting the number of the pulse waves generated from every second, and subsequently transmit the counted result to said control module 18 for corresponding handling. The first processing module 14 is comprised of an analog to digital converting module 140 and a frequency-counting module 142 as shown in FIG. 2B.

Th analog to digital converting module 140 is used for converting the magnified signals into pulse wave signals transistor-transistor analog; TTL), and further transmitting to the frequency-counting module 142 for counting the frequency of said pulse wave signals, and subsequently transmitting the counted result to said control module 18 so as to measure the rotation speeds of the fan accordingly. The analog to digital converting module 140 is an analog to digital converter; ADC), and similarly, the foregoing analog to digital converter; ADC can be replaced with an electronic device or circuit having similar functions depending on the practical implementations and requirements. The frequency-counting module 142 is a single chip circuit adapted for counting the frequency, and likewise, the single chip circuit can be replaced with an electronic device or circuit having similar functions depending on the practical implementations and requirements.

Figure 2C:
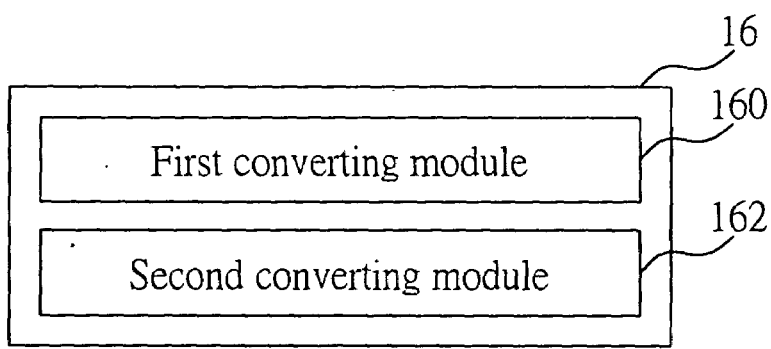
FIG. 2C is a schematic diagram depicting the structure of a second processing module as shown in FIG. 1.

The second processing module 16 is used for receiving the pulse wave current signal detected by the detecting module 10, and further processing said pulse wave current signal so as to generate a digital signal, which then is transmitted to a control module for corresponding handling. The second processing module 16 is comprised of a first converting module 160 and a second converting module 162 as shown in FIG. 2C.

The first converting module 160 is used for receiving the pulsation electric signal detected by the detecting module 10, and further converting the pulsation electric signal into a direct current signal, thereby allowing the second converting module 162 to convert the direct current signal into a digital signal and output the converted digital signal to the control module 18. The first converting module 160 is an average current circuit used to process and convert the pulsation current signal into an output direct current. Similarly, the average current circuit can be replaced with an electronic device or circuit having similar functions depending on the practical implementations and requirements. The second converting module 162 is a voltage signal analog capable of converting direct currents flowing through therein into digital voltage signals and transmit to the control module 18, and can read directly and concurrently the value of said digital voltage signal using the voltage signal analog. Similarly, the voltage signal analog can be replaced with an electronic device or circuit having similar functions depending on the practical implementations and requirements.

The control module 18 is used for measuring the rotation speeds of the fan 2 based on the frequency of the pulse wave signal calculated by the first processing module 14, and more particularly, the control module 18 proceeds to measure the rotation speed of the fan 2 according to the frequency of the pulse wave signal in the manner (1):

Revolutions per minute (rpm) equals to (n1 divided by n2) multiplied by 60     (1)

Moreover, the control module 18 is capable of measuring the working currents of the fan 2 based on the digital signal generated by the second processing module 16, and particularly, the control module 18 measures the working currents of the fan 2 according to the digital voltage signal V transmitted from the voltage signal analog and the Re equivalent resistance frequency of the pulse wave signal in the manner (2):

Working currents equals to Voltage multiplied by Re     (2)

The foregoing control module 18 is a control software (not shown) for installing in a computer system, enabling the computer system to precisely measure the rotation speeds and working currents of the fan 2 via the control software, which also can effectively control the operating status of the fan 2, thereby ensuring operating reliability.

Summarizing the above, the fan operating status monitoring system of the invention is implemented by employing a detecting module to detect pulsation currents generated from the rotation of a fun, and further convert the detected pulsation current to a voltage signal, allowing a differential magnifying module 12, a first processing module 14, and a second processing module 18 to process the pulse wave signal in orders so as to measure the rotation speeds of the fan. Also, the invention is capable of converting tiny pulse current signals into pulse voltage signals, and further generating magnified signals processed by a differential magnifying module so as to be further processed by the first processing module 14, thereby expanding the measuring range of the rotation speeds of a fan. Moreover, the fan operating status monitoring system of the invention is capable of converting the detected electric current signals by the detecting module 10 into digital signals by means of a control module 16, enabling said control module 18 to measure the working currents of a fan operation based on the converted digital signals. Lastly, the fan operating status monitoring system of the invention can effectively control the operating status of the fan 2 according to the calculated results by means of the control module 18. The invention, therefore, offers advantages over the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fan operating status monitoring system, comprising:
   a detecting module, which is used for detecting pulsation currents generated from a rotation of a fan, and further converting the detected pulsation currents to pulsation voltage signals;
   a differential magnifying module, which is used for receiving said pulsation voltage signals, and further processing the received pulsation voltage signals by differential magnification and wave filtering so as to generate analog magnification signals;
   a first processing module, which is used for receiving said analog magnified signals, and further converting said analog magnified signals into pulse wave signals in order to measure a frequency of said pulse wave signals;
   a second processing module, which is used for receiving the pulsation currents detected by the detecting module, and further processing said pulsation currents so as to generate digital signals and then transmitting the digital signals; and
   a control module, which is used for receiving the digital signals transmitted from the second processing module and measuring a speed of the rotation of the fan based on the frequency of the pulse wave signals calculated by the first processing module, and further measuring the working currents of the fan based on the digital signals generated by the second processing module.

2. The fan operating status monitoring system of claim 1, wherein the detecting module is an electric resistance in series connection with the fan.

3. The fan operating status monitoring system of claim 2, wherein the differential magnifying module is a differential signal sensor circuit that can intercept voltage signals on both ends of said electric resistance, and also proceed to magnify the intercepted voltage signals by means of differentiation and wave filtering so as to generate output of magnified signals.

4. The fan operating status monitoring system of claim 1, wherein the first processing module is comprised of:
   an analog to digital converting module used for converting the magnified signals into pulse wave signals; and
   a frequency-counting module used for receiving said pulse wave signals to count the frequency of said pulse wave signals, and further transmitting the counted result to said control module for calculating the rotation speeds of the fan accordingly.

5. The fan operating status monitoring system of claim 4, wherein the analog to digital converting module is an analog to digital converter.

6. The fan operating status monitoring system of claim 4, wherein the frequency-counting module 142 is a single chip circuit adapted for counting the frequency.

7. The fan operating status monitoring system of claim 1, wherein the second processing module is comprised of:
   a first converting module used for receiving the pulsation currents detected by the detecting module, and further converting the pulsation currents into direct electric current signals; and
   a second converting module for converting direct electric current signals into digital signals, and further transmitting digital signals to a control module for calculating the working electric currents of the fan accordingly.

8. The fan operating status monitoring system of claim 7, wherein the first converting module is an average current circuit.

9. The fan operating status monitoring system of claim 7, wherein the second converting module is a voltage measuring device that can convert the direct current flowing through therein into digital voltage signals, allowing the control module to measure the working currents of the fan according to said digital voltage signals and the equivalent electric resistance measured by said voltage measuring device.

* * * * *